(12) United States Patent
Boetzel et al.

(10) Patent No.: US 7,129,737 B2
(45) Date of Patent: Oct. 31, 2006

(54) METHOD FOR AVOIDING TRANSIENTS DURING SWITCHING PROCESSES IN INTEGRATED CIRCUITS, AND AN INTEGRATED CIRCUIT

(75) Inventors: Ulrich Boetzel, Kaarst (DE); Frank Gersemsky, Recklinghausen (DE); Markus Hammes, Dinslaken (DE); Christian Kranz, Ratingen Lintorf (DE); Rüdiger Lorenz, Dinslaken (DE); André Neubauer, Krefeld (DE); Bernd Schmandt, Wuppertal (DE); Michael Warmers, Erkelenz (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/494,991

(22) PCT Filed: Oct. 18, 2002

(86) PCT No.: PCT/DE02/03943

§ 371 (c)(1),
(2), (4) Date: Nov. 5, 2004

(87) PCT Pub. No.: WO03/043192

PCT Pub. Date: May 22, 2003

(65) Prior Publication Data

US 2005/0062516 A1 Mar. 24, 2005

(30) Foreign Application Priority Data

Nov. 12, 2001 (DE) ............................... 101 55 428

(51) Int. Cl.
*H03K 17/16* (2006.01)
(52) U.S. Cl. .......................................... 326/26; 326/82

(58) Field of Classification Search ............ 326/26–28, 326/82, 83, 86, 93–98
See application file for complete search history.

(56) References Cited

U.S. PATENT DOCUMENTS

| 4,063,146 | A | * | 12/1977 | Oliver ........................ 323/241 |
| 4,752,703 | A | | 6/1988 | Lin |
| 5,525,913 | A | * | 6/1996 | Brooks et al. .............. 324/771 |
| 5,646,572 | A | * | 7/1997 | Masleid ....................... 327/542 |
| 5,724,297 | A | | 3/1998 | Noda et al. |
| 6,127,839 | A | * | 10/2000 | Martin et al. .................. 326/27 |
| 6,498,524 | B1 | * | 12/2002 | Kawasaki et al. ........... 327/158 |
| 6,556,643 | B1 | * | 4/2003 | Merritt ......................... 377/16 |
| 2001/0019279 | A1 | | 9/2001 | Martin et al. |

FOREIGN PATENT DOCUMENTS

| DE | 196 80 526 C2 | 4/1999 |
| EP | 0 485 918 A2 | 5/1992 |
| WO | WO 95/24076 A1 | 9/1995 |
| WO | WO 00/27032 A1 | 5/2000 |

OTHER PUBLICATIONS

International Search Report, Int. Application No. PCT/DE02/03943, Int. Filing Date Oct. 18, 2002, 3 pgs.

* cited by examiner

*Primary Examiner*—Don Le
(74) *Attorney, Agent, or Firm*—Eschweiler & Associates, LLC

(57) ABSTRACT

In a method for avoiding transients during switching processes in integrated circuits, a module of the integrated circuit is switched from a first operating state to a second operating state, a load change occurring thereby. In this case, it is ensured that the occurring quotient of load change and time duration for the transition from the first operating state to the second operating state does not exceed a predetermined limit value, thereby reducing or avoiding transients associated with such switching.

35 Claims, 2 Drawing Sheets

METHOD FOR AVOIDING TRANSIENTS DURING SWITCHING PROCESSES IN INTEGRATED CIRCUITS, AND AN INTEGRATED CIRCUIT

RELATED APPLICATION

This application is a national stage application of International Application No. PCT/DE02/03943 filed Oct. 18, 2002, which is entitled "METHOD FOR AVOIDING TRANSIENTS DURING SWITCHING PROCESSES IN INTEGRATED CIRCUITS, AND AN INTEGRATED CIRCUIT", which was not published in English, and claims priority to German Patent Application Ser. No. 101 55 428.1, which was filed on Nov. 12, 2001, which is hereby incorporated by reference in its entirety.

FIELD OF THE INVENTION

The invention relates to a method for avoiding transients during switching processes in integrated circuits and to an integrated circuit in which measures are taken to avoid transients.

BACKGROUND OF THE INVENTION

On account of switching processes, load fluctuations of greater or lesser magnitude occur in integrated circuits (IC). By way of example, load fluctuations are brought about by the occasional activation or deactivation of partial regions or modules of an IC. Such connectable or disconnectable modules are being employed more and more in modern ICs since they enable a demand-oriented control of the power consumption of the IC. A module is activated only when it is currently needed. For the rest of the time, the module is in an operating state with low or no power consumption. The change between operating states is usually performed by disconnection of the supply voltage or by disconnection or reduction of the clock frequency of the module.

What is disadvantageous in this case is that the switching processes produce undesirable transients on the supply lines, which can have a disturbing effect on other chip components. The higher the number of switchable modules, the greater the difficulties to be expected. So-called "mixed signal" systems, which combine digital and analog assemblies on an IC, are particularly susceptible to the occurrence of transients.

In order to reduce the harmful influence of transients, it is already known to protect sensitive components of the chip from the transients by means of suitable shielding.

SUMMARY OF THE INVENTION

The invention is based on the object of specifying a method which makes it possible to reduce the harmful influence of transients in integrated circuits. Furthermore, the invention aims to provide an integrated circuit having low susceptibility to disturbances caused by transients.

By virtue of the fact that, in accordance with the features of the invention, it is ensured that the quotient—occurring during the switching process of a clocked module—of load change and time duration for the transition from the first operating state to the second operating state with altered computation capacity compared with the first operating state does not exceed a limit value that is predetermined or can be predetermined in a targeted manner, the transient occurring during the switching process is limited. This is based on the fact that the size of the disturbance caused by the transient is proportional to the quotient of load change and changeover time duration (i.e. the time duration for the transition between the two operating states). The transition from the first operating state to the second operating state is produced by changing the clock frequency of the clocked module.

According to a first particularly preferred exemplary embodiment of the invention, the transient suppression is achieved by ensuring, during the switching process, that the time duration for the transition from the first operating state to the second operating state does not fall below a time limit that is predetermined or can be predetermined in a targeted manner. This means that an abrupt changeover between the two operating states (as is customary in the prior art) is replaced by a gradual increasing or decreasing of an operating quantity which effects the change from the first operating state to the second operating state. In this case, the changeover time duration may be kept relatively short e.g. in the case of small load changes (i.e. in the case of a module which exhibits only a small load difference in the two operating states), while correspondingly longer changeover time durations are to be provided when larger load differences occur. In this case, the predetermined time limit for the changeover time duration may also be made dependent on other influencing quantities, for example on whether other modules in the chip that are particularly sensitive to transients are active or inactive during the switching process.

In many cases, e.g. in the case of disconnection of a module, the targeted lengthening of the transition time duration for the switching process is associated with no practical disadvantages.

The transition from the first operating state to the second operating state may advantageously be effected in step-by-step or progressive fashion or else in continuous fashion.

A second exemplary embodiment of the method according to the invention is based on a module subdivided into individually switchable submodules. It is characterized in that the switching of the module from the first operating state to the second operating state is carried out by sequential switching, in particular disconnection, of the submodules. As a result of the sequential switching of individual submodules, instead of an overall load change, a plurality of smaller load changes are carried out successively, as a result of which the transient that occurs is limited.

In a further second method according to the invention for avoiding transients during switching processes in integrated circuits, the load change occurring during the to the invention, the load change occurring during the switching of the module from the first operating state to the second operating state is essentially compensated for by simultaneous supplementary connection or disconnection of a dummy load. After the supplementary connection of the dummy load, the latter is controlled, with the result that the overall load is reduced. Since the supplementary connection of the dummy load is effected at the same time as the switching of the module, the switching process as such can be abrupt. The occurrence of transients is prevented here by the fact that the overall load change occurring during the switching process remains small. Controlling the magnitude of the dummy load after the connection thereof makes it possible to reduce the overall load, which now again has to be effected "slowly", i.e. taking account of the lower time limit for changeover processes, since the transient would otherwise occur during the disconnection of the dummy load.

Preferably the magnitude of the dummy load is controlled before the supplementary connection or disconnection of the dummy load. Controlling the magnitude of the dummy load before switching makes it possible to use a dummy load for switching processes of different modules.

One advantageous embodiment variant of the second method of the invention is characterized in that the operating quantity that affects the transition from the first operating state to the second operating state is the operating voltage of the module. In this case, e.g. in the first exemplary embodiment of the invention, the operating voltage is increased or decreased "slowly" during a switching process. A further, likewise advantageous embodiment variant of the second method of the invention is characterized in that the operating quantity is the clock frequency of the module. In this case, e.g. in the first exemplary embodiment of the invention, the operating state of the module is changed by means of a "retarded" transition between the two clock frequencies.

In all the exemplary embodiments of the invention, the two operating states considered are preferably the switched-on state and the switched-off state of the module. Another possibility is for one of the two operating states to be a state with a reduced operating voltage or reduced clock frequency. This may be e.g. a standby state or, given a reduced clock frequency, a state with a reduced computation capacity and power consumption.

Switching processes of individual modules to states with a reduced power consumption are of interest particularly in the case of chips in the field of mobile radio. Since the power consumption of the ICs in mobile radio receivers is subject to strict limitations, it is of particular interest here to effect "low" clocking of individual modules if only a medium or low computing power is required of them in certain situations. On account of this, the invention enables the disturbing influences brought about by transients to be significantly reduced in the case of a power management of modules in a chip.

An IC in accordance with the invention has a means for producing an operating quantity that affects the transition between the operating states for the clocked module, the operating quantity being the clock frequency of the clocked module. In this case, said means ensures, during a switching process, that the time duration for the transition from the first operating state to the second operating state does not fall below a time limit that is predetermined or can be predetermined in a targeted manner.

Preferably, the means for producing the operating quantity comprises an operating quantity generator, which produces a fixed value of the operating quantity, and an operating quantity modulator, to which the fixed operating quantity value is fed and which can provide, at its output, an operating quantity that can be varied between a first operating quantity value, at which the module is in the first operating state, and a second operating quantity value, at which the module is in the second operating state.

Furthermore the integrated circuit preferably has a control means, which drives the operating quantity modulator during a switching process. The time duration for the transition from the first to the second operating quantity value can be predetermined in variable fashion by means of the control means. Said time duration may be dependent on the load change occurring during the switching process and/or dependent on further influencing quantities, such as, for example, the operating states of other modules of the IC.

An alternative IC in accordance with the invention has a plurality of modules that can be switched selectively between a first operating state and a second operating state. Furthermore, the IC comprises means for switching each module and also means for simultaneous supplementary connection or disconnection of a dummy load, which essentially compensates for the load change occurring during the switching of a module for each of the modules. In this case, the magnitude of the dummy load is adjustable before the switching process in a manner dependent on the module to be switched. This limits transients during the switching process.

One of the two alternative integrated circuits preferably comprises both analog and digital modules. In this case, the switchable module considered may also be both an analog and a digital module.

BRIEF DESCRIPTION OF THE DRAWINGS

The invention is explained below using exemplary embodiments with reference to the drawing, in which.

DETAILED DESCRIPTION OF THE INVENTION

Modern ICs comprise a multiplicity of components or modules of different complexity and different construction. In this case, in order to obtain higher system integration, analog and digital modules are also realized on one and the same IC. By way of example, an IC may comprise one or more A/D converters, D/A converters, logic units, memory areas and also a microprocessor or a microcontroller as different modules. In the field of mobile radio applications, analog radiofrequency components (e.g. mixing stages) are realized together with digital baseband assemblies (e.g. digital filters) on an IC. A further example of IC-integrated modules is task-specific hardware data paths which execute specific predetermined computation tasks in sequential logic.

A module in the sense of the invention is thus an essentially autonomous functional unit or assembly in an IC which cooperates with other components or further switchable modules of the IC, the module generally participating in specific shared resources such as, for example, the power supply or clock generation of the IC.

Figure 1:
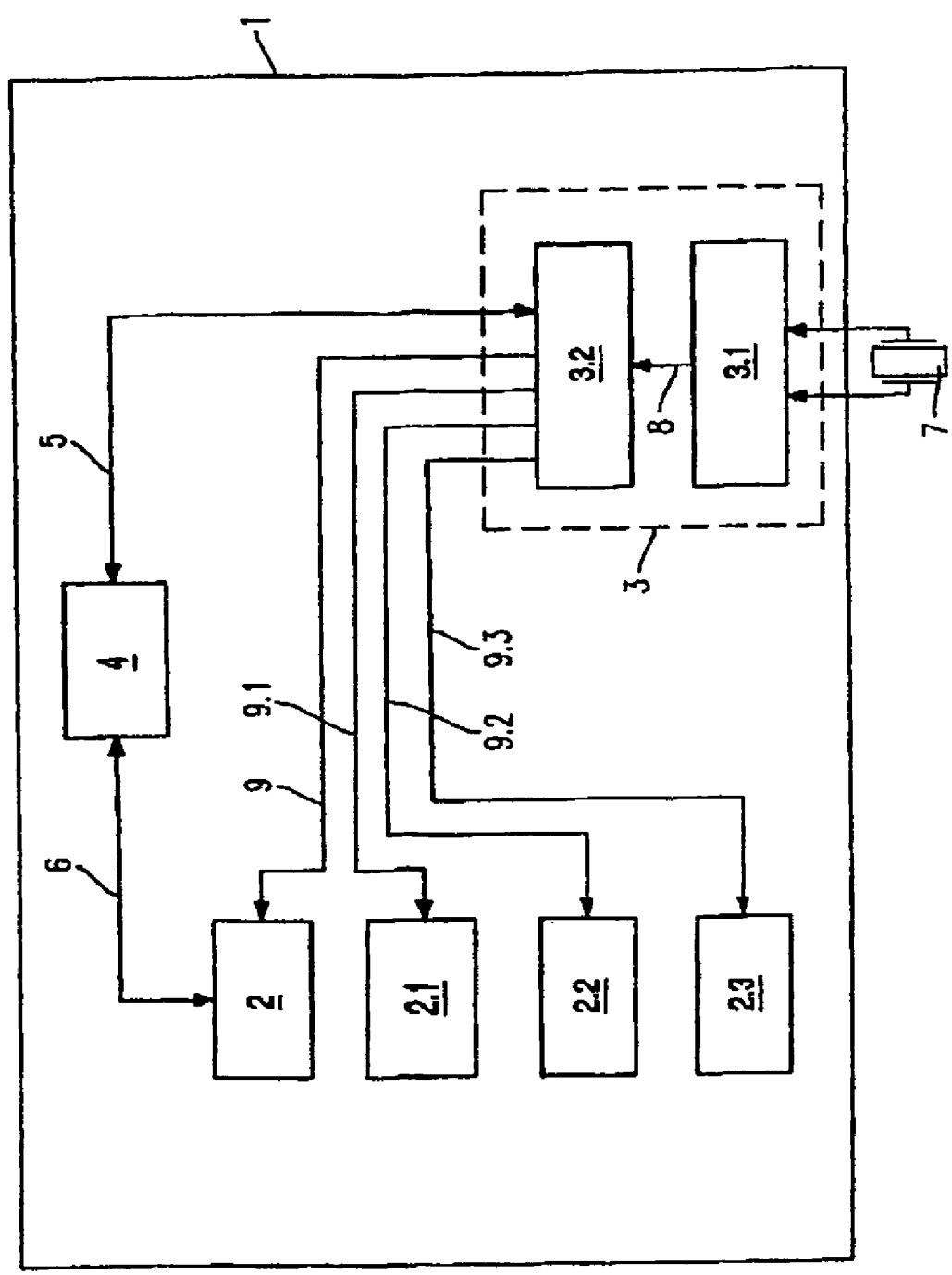
FIG. 1 shows a simplified block diagram for elucidating the construction of a first exemplary embodiment of an IC according to the invention.

FIG. 1 shows, in a simplified illustration, the construction of such an IC 1 in the form of a block diagram. The IC 1 comprises a central processing unit (CPU) 2 and a plurality of further modules 2.1, 2.2 and 2.3. The modules 2.1 to 2.3 perform different, task-specific functions of the IC 1 and may be realized for example in the form of the abovementioned functional units.

The IC 1 furthermore comprises a clock generating circuit 3, which is constructed from a clock generator 3.1 and a clock divider 3.2 in the example illustrated here. The clock generator 3.1 is operated by an external oscillating crystal 7. It generates a fixed clock frequency which is fed to the clock divider 3.2 via a line 8.

A control circuit 4 is connected both to the clock divider 3.2 and to the central processing unit 2 via bi-directional data connections 5 and 6.

The clock divider 3.2 generates the clock signals for the central processing unit 2 and the diverse modules 2.1, 2.2 and 2.3. The clock lines via which the clock signals are passed to the units and modules mentioned are designated by the reference symbol 9 (for the CPU 2), 9.1 (for the module 2.1), 9.2 (for the module 2.2) and 9.3 (for the module 2.3) in FIG. 1.

The circuit illustrated in FIG. 1 functions as follows:

By way of example, the module 2.2 is intended to be switched to an operating state with a low power consumption on account of low capacity utilization. The possibility of effecting lower clocking of the module 2.2 is recognized in the central processing unit 2 and corresponding information is sent to the control circuit 4 via the data connection 6. The operating states and clock frequencies of the central processing unit 2 and of all the modules 2.1, 2.2 and 2.3 may be known to the control circuit 4, which may simultaneously be a state monitoring device, or are communicated to said control circuit via the data connections 6 and 5, respectively. With such system information optionally being taken into account, the control circuit 4 instructs the programmable frequency divider 3.2 to reduce the clock frequency for the module 2.2 to a desired target value. This target value may either be determined in variable fashion by the central processing unit 2 or be fixedly predetermined.

A special case exists when the module 2.2 is intended to be disconnected. In this case, the target value is 0 Hz.

However, the frequency divider 3.2 does not perform an abrupt change of the clock frequency for the module 2.2 to the target value, but rather carries out a slow transition in the frequency from its original value to the target value. This may be effected either in a plurality of discrete steps or in continuous fashion. On account of the fact that a specific, predetermined time duration for the transition is not undershot, the occurrence of transients can be avoided or limited as desired.

The transition time duration may either be a system-wide fixed time duration for all the modules 2.1, 2.2 and 2.3 or the time duration may be determined individually for each module 2.1, 2.2, 2.3. Furthermore, the time duration can be set by the control circuit 4 taking account of the type of state change (e.g. switching-on or disconnection) and/or the load change associated with the changeover and, if appropriate, taking account of further system parameters which are dependent on the state of other modules 2.1, 2.2, 2.3.

Figure 2:
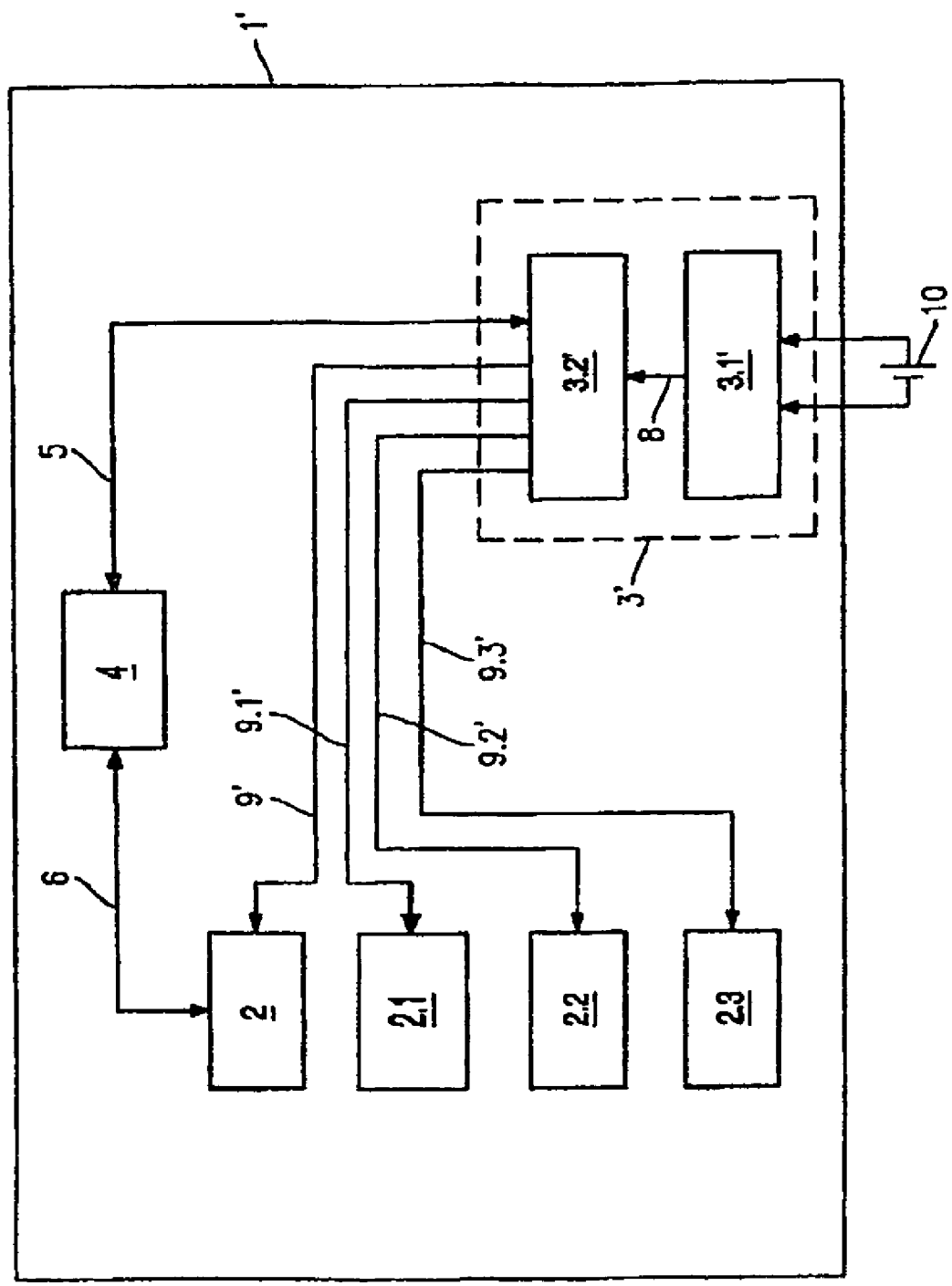
FIG. 2 shows a simplified block diagram for elucidating the construction of further exemplary embodiments of an IC according to the invention.

FIG. 2 diagrammatically shows a second exemplary embodiment of the invention. The same or functionally comparable parts are identified by the same reference symbols as in FIG. 1. The essential difference between the first exemplary embodiment illustrated in FIG. 1 and the second exemplary embodiment illustrated in FIG. 2 is that, in the second exemplary embodiment the transition of a module 2.1, 2.2 or 2.3 from a first operating state to a second operating state is effected by a change in the supply voltage of the corresponding module. In this respect, the reference symbol 3.1' designates a circuit for generating a supply voltage and the reference symbol 3.2' designates a circuit for controlling and altering the supply voltage obtained from the circuit 3.1' via the line 8. The reference symbol 10 designates an external power source, for example a battery, and the reference symbol 3.2" designates a circuit for generating the supply voltages for the central processing unit 2 and the modules 2.1, 2.2 and 2.3. The supply voltage lines via which the supply voltages are passed to the modules mentioned are designated by the reference symbols 9' (for the CPU 2), 9.1' (for the module 2.1), 9.2' (for the module 2.2) and 9.3' (for the module 2.3) in FIG. 2.

The functioning of the components of the IC 1' is analogous to the functioning of the components of the IC 1. The analogy consists in the fact that operating voltages or operating voltage changes and associated switching processes are now considered instead of clock frequencies or clock frequency changes. In order to avoid repetition, reference is made to the description concerning the first exemplary embodiment in the sense of this analogy.

A further exemplary embodiment of the invention is likewise explained with reference to FIG. 2. The module 2.2 to be switched is supplemented by a dummy load, which is intended to be represented here by the reference symbol 2.3. Unlike in the first or second exemplary embodiment of the invention, the switching process with regard to the module 2.2 can now be carried out abruptly. At the same time, the dummy load 2.3 is likewise supplementarily connected abruptly. The dummy load 2.3 is dimensioned such that it precisely compensates for the load change effected by the switching of the module 2.2. Since, as a consequence, no or only a very small overall load change is associated with the switching process, the occurrence of transients is effectively suppressed.

The dummy load 2.3 may be of adjustable magnitude, as a result of which two different things are achieved: firstly, it can be used during switching processes for different load changes or modules. Secondly, it can be slowly choked after supplementary connection, as a result of which the overall load—and thus the current consumption—is reduced again in a desired manner.

In a further exemplary embodiment, not specifically illustrated, the module to be switched is constructively subdivided into a plurality of submodules which are individually switchable. The switching of the module is carried out in the form of sequential switching of the individual submodules, so that the module, e.g. during disconnection, is ramped down section by section (i.e. submodule by submodule).

It is pointed out that all the exemplary embodiments can be combined. In other words, it is conceivable for the IC to comprise both functional elements which are put into different states by means of a protracted switching process for the operating voltage and to comprise modules in which operating state changes are brought about by a protracted frequency change. Furthermore, it is possible to provide abrupt switching processes with supplementary connection or disconnection of the dummy load of suitable magnitude or sequential disconnection of a module subdivided into submodules. With regard to an individual module, too, it is possible, in principle, for a plurality of the possibilities mentioned to be realized. In this case, an integrated circuit according to the invention comprises e.g. both frequency and voltage control devices which may be embodied in accordance with the circuits 3 and 3' and are provided with corresponding peripherals 7, 10. Furthermore, the dummy load 2.3 is required if the intention is to realize changeovers with the participation of a dummy load 2.3.

The invention claimed is:

1. A method for avoiding transients during switching processes in integrated circuits, comprising:
    switching a clocked computational module of the integrated circuit from a first operating state to a second operating state, the second operating state having altered computation capacity compared with the first operating state, a load change occurring thereby, and the transition from the first operating state to the second operating state being produced by gradually changing a clock frequency of the clocked module, and
    ensuring that a quotient of load change and time duration for the transition from the first operating state to the second operating state does not exceed a predetermined limit value.

2. The method as claimed in claim 1, wherein the time duration for the transition from the first operating state to the second operating state does not fall below a predetermined time limit.

3. The method as claimed in claim 2, wherein ensuring comprises controlling the time duration for the transition from the first operating state to the second operating state.

4. The method as claimed in claim 1 wherein the transition from the first operating state to the second operating state is effected in step-by-step fashion.

5. The method as claimed in claim 1 wherein the transition from the first operating state to the second operating state is effected in continuous fashion.

6. The method as claimed in claim 2, the clocked computational module being subdivided into individually switchable submodules, wherein the switching of the clocked computational module from the first operating state to the second operating state is carried out by sequential disconnection of the submodules.

7. The integrated circuit as claimed in claim 3, wherein the integrated circuit comprises analog and digital modules.

8. The method as claimed in claim 1, wherein the two operating states are a switched-on state and a switched-off state.

9. The method as claimed in claim 1, wherein the two operating states are a switched-on state and a reduced clock frequency state.

10. The method as claimed in claim 1, wherein the clocked computational module is a microprocessor or a microcontroller.

11. The method as claimed in claim 1, wherein the clocked computational model is an analog to digital converter.

12. The method as claimed in claim 1, further comprising generating the clock frequency by a clock generating circuit.

13. A method for avoiding transients during switching processes in integrated circuits, comprising:
    switching a module of the integrated circuit from a first operating state to a second operating state, a load change occurring thereby, wherein the switching from the first operating state to the second operating state is produced by changing the operating voltage of the module,
    simultaneously supplementarily connecting a dummy load, which compensates for the load change occurring during the switching of the module,
    ensuring that the load change occurring during the switching process for the transition from the first operating state to the second operating state does not exceed a predetermined limit value, and
    controlling a magnitude of the dummy load after the supplementary connection of the dummy load, so that the overall load is reduced.

14. The method as claimed in claim 13, wherein the magnitude of the dummy load is controlled before the supplementary connection or disconnection of the dummy load.

15. The method as claimed in claim 13, wherein the two operating states are the switched-on state and the switched-off state.

16. The method as claimed in claim 13 wherein the two operating states are the switched-on state and a state with a reduced supply voltage of the module.

17. An integrated circuit comprising:
    at least one clocked computational module that is switched selectively between a first operating state and a second operating state with the second operating state having an altered computation capacity compared with the first operating state, the switching between the operating states being associated with a load change,
    a means for producing an operating quantity that affects the switching between the operating states for the clocked computational module,
    the means for producing the operating quantity ensuring, during a switching process, that a time duration for the transition from the first operating state to the second operating state does not fall below a predetermined time limit for gradually changing the operating quantity during the switching process, and
    the operating quantity is a clock frequency of the clocked computational module.

18. The integrated circuit as claimed in claim 17, wherein the means for producing the operating quantity comprises:
    an operating quantity generator for producing a fixed value of the operating quantity, and
    an operating quantity modulator, to which the fixed operating quantity value is fed and which provides, at its output, an operating quantity that is varied between a first operating quantity value, at which the clocked computational module is in the first operating state, and a second operating quantity value, at which the clocked computational module is in the second operating state.

19. The integrated circuit as claimed in claim 18, further comprising a control means, which drives the operating quantity modulator during a switching process.

20. The integrated circuit as claimed in claim 19, wherein the control means is designed to predetermine the time duration for the transition from the first to the second operating quantity value.

21. The integrated circuit as claimed in claim 18, wherein the operating quantity modulator is a clock divider circuit with different clock divider factors.

22. The integrated circuit as claimed in claim 17, wherein the integrated circuit comprises a chip of a mobile station of a mobile radio system.

23. The integrated circuit as claimed in claim 17, wherein the at least one clocked computation module includes a microprocessor or a microcontroller.

24. An integrated circuit comprising:
    a plurality of modules that are selectively switchable between a first operating state and a second operating state, a change between the operating states being associated with a load change,
    means for switching each module from the first operating state to the second operating state, and
    means for simultaneous supplementary connection or disconnection of a dummy load, which compensates for the load change occurring during the switching of a module for each of the modules, a magnitude of the dummy load being adjustable before the switching process in a manner dependent on the module to be switched, thereby limiting transients during the switching process.

25. A method for avoiding transients during switching processes in an integrated circuit, the integrated circuit comprising a clocked computational module operating in at least a first and a second operating states, the first and second operating states having different computational capacity, a clocking circuit for clocking the clocked computational module and a monitoring circuit for monitoring the operational state of the clocked computational module, the method comprising:
    monitoring the operational state of the clocked computational module;

instructing the clocking circuit by the monitoring circuit to change the clock frequency when the clocked module is to be switched from the first operational state to the second operational state; and gradually changing the clock frequency by the clocking circuit ensuring that a quotient of load change and time duration for transition from the first operational state to the second operational state does not exceed a predetermined value.

26. The method as claimed in claim 25, wherein the clocked computational module comprises individually switchable submodules and wherein the switching of the clocked computational module from the first operating state to the second operating state is carried out by switching on and/or sequential disconnection of the submodules.

27. The method of claim 25, wherein the clocked computational module is a microprocessor or a microcontroller.

28. An integrated circuit comprising:
- a clocked computational module comprising a first operational state having a first operational capacity and a first power consumption value and a second operational state having a second operational capacity and a second power consumption value;
- a monitoring circuit that monitors the clocked computational module to transition the clocked computational module from the first operational state to the second operational state; and
- a clocking circuit that clocks the clocked computational module at a clock frequency, wherein the clocking circuit gradually alters the clock frequency on the transition from the first operational state to the second operational state from a first value to a second value.

29. The integrated circuit of claim 28, wherein the clocking circuit ensures that a load change during the transition is within a predetermined load value and a time duration for the transition is within a predetermined time value.

30. The integrated circuit of claim 28, wherein the second operational capacity is different than the first operational capacity.

31. The integrated circuit of claim 28, wherein the clocked computational module comprises individually submodules switchable according to the first operational state and the second operational state.

32. The integrated circuit of claim 28, wherein the second power consumption value different than the first power consumption value.

33. The integrated circuit of claim 28, wherein the second value is less than the first value.

34. The integrated circuit of claim 28, wherein the clocked computational module is a microprocessor or a microcontroller.

35. The integrated circuit of claim 28, wherein the clocked computational module is a digital to analog converter.

* * * * *